(12) United States Patent
Nishikubo et al.

(10) Patent No.: US 6,867,282 B2
(45) Date of Patent: *Mar. 15, 2005

(54) PHOTOCURABLE AND THERMOSETTING RESIN COMPOSITION

(75) Inventors: Tadatomi Nishikubo, Fujisawa (JP); Atsushi Kameyama, Yokohama (JP); Masatoshi Kusama, Sakado (JP)

(73) Assignees: Kanagawa University (JP); Taiyo Ink Manufacturing Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/452,516

(22) Filed: Jun. 3, 2003

(65) Prior Publication Data

US 2003/0216514 A1 Nov. 20, 2003

Related U.S. Application Data

(63) Continuation of application No. PCT/JP01/10329, filed on Nov. 27, 2001, now abandoned.

(30) Foreign Application Priority Data

Dec. 4, 2000 (JP) ........................................ 2000-368536

(51) Int. Cl.$^7$ ................................................ C08G 2/06
(52) U.S. Cl. ......................... 528/408; 528/406; 526/319
(58) Field of Search ................................ 528/406, 408; 526/319

(56) References Cited

FOREIGN PATENT DOCUMENTS

| JP | 09-136942 A1 | 5/1997 |
| JP | 2000-248024 A1 | 9/2000 |
| WO | 97/16470 | * 5/1997 |

OTHER PUBLICATIONS

"A Novel Synthesis of Polyesters with Pendant . . . ", T. Nishikubo, A. Kameyama, A. Suzuki, Reactive & Functional Polymers 37 (1998); pp. 19–25.

"A Novel Synthesis of Polyethers with Pendant Hydroxyl . . . ", T. Nishikubo, A. Kameyama, M. Ito, T. Nakajima, H. Miyazaki, Journal of Polymer Science, Part A; Polymer Chemistry, vol. 37, pp. 2781–2790, (1999).

"New addition Reactions of Cyclic Ethers with Esters and Thioesters . . . ", T. Nishikubo and K. Sato, Chem. Letters, pp. 697–700; (1991).

International Search Report Jan. 5, 2002.

* cited by examiner

Primary Examiner—Kuo-Liang Peng
(74) Attorney, Agent, or Firm—Rader, Fishman & Grauer, PLLC; Ronald P. Kananen

(57) ABSTRACT

The photocurable and thermosetting resin composition of the present invention includes (A) an actinic energy ray-curable resin having at least one structure represented by the following general formula (1), (B) a photopolymerization initiator, (C) a diluent, and (D) a thermosetting component.

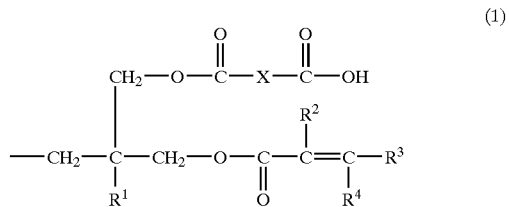

In the general formula (1), $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

10 Claims, No Drawings

PHOTOCURABLE AND THERMOSETTING RESIN COMPOSITION

CROSS-REFERENCE TO RELATED APPLICATIONS

This is a continuation of Application PCT/JP01/10329, filed Nov. 27, 2001, now abandoned.

BACKGROUND OF THE INVENTION

1. Field of the Invention

This invention relates to a photocurable and thermosetting resin composition which is usable in various application fields such as a solder resist and an etching resist to be used in the production of a printed circuit board, an interlaminar insulating material for a build-up circuit board, a plating resist, a photosensitive dry film, and the production of a fluorescent material for PDP (plasma display panel), specifically a photocurable and thermosetting resin composition which is developable with an aqueous alkaline solution and capable of producing a coating film excelling in resistance to heat, adhesiveness, etc.

2. Description of the Prior Art

In the soldering process which is carried out in mounting electronic parts on a printed circuit board, a solder resist is used for the purpose of preventing molten solder from adhering to irrelevant portions and protecting circuits. In recent years, a developing type solder resist which is used to form a pattern by a photolithographic method is widely adopted. Particularly, with respect to the problem of environmental safety and from the viewpoint of cost, the solder resist of the alkali developing type has come to play the leading role. As a base resin used for these developing type solder resists, an actinic energy ray-curable resin obtained by reacting an epoxy resin with (meth)acrylic acid and subsequently reacting an acid anhydride with the resultant hydroxyl group of the modified resin is generally used.

Meanwhile, in consequence of the trend of IC and LSI parts toward highly dense mounting, the necessity of decreasing the width of circuit lines and the intervals between circuits of the printed circuit boards has been finding growing recognition. Besides, since the operating frequency of these parts to be mounted is enhanced, the heat value released from these parts increases accordingly. Therefore, the printed circuit board tends to require high thermal stability more than desired heretofore. In the actinic energy ray-curable resin obtained by using an epoxy resin as a starting raw material, however, since most of the functional groups which bond to an acid anhydride are secondary hydroxyl groups, the resin has the problem of relatively easily suffering the breakage of bonds when exposed to an increased temperature for a long time and, as result, inducing the possibility of degradation of such properties as insulation properties and resistance to heat and contamination of circuits due to the scattering of the decomposed acid anhydride.

In recent years, from the viewpoints of creation of a new organic reaction and its application to the synthesis of macromolecular compounds, the organic reaction involving the ring opening addition reaction of an oxetane ring which is an ether of four-membered ring has been studied. For example, the addition reaction of an oxetane compound and an active ester (T. Nishikubo and K. Sato, Chem. Lett., 697 (1992)) and the synthesis of polyester having a primary hydroxyl group attached to a side chain thereof by the polyaddition reaction of a bisoxetane and a dicarboxylic acid (T. Nishikubo, A. Kameyama, and A. Suzuki, Reactive & Functional Polymers, 37, 19 (1998)) have been studied and reported. Further, the polyaddition reaction of a bisoxetane and a bisphenol has been reported recently (T. Nishikubo, A. Kameyama, M. Ito, T. Nakajima, and H. Miyazaki, Journal of Polymer Chemistry, Vol. 37, pp. 2781–2790(1998)) and tetraphenyl phosphonium bromide (TPPB) etc. are used as a reaction catalyst. However, these published articles make no mention of an actinic energy ray-curable resin of the present invention and a photocurable and thermosetting resin composition using the same.

SUMMARY OF THE INVENTION

An object of the present invention, therefore, is to solve the problems of the prior art mentioned above and to provide a novel alkali developing type photocurable and thermosetting resin composition which excels in resistance to heat, thermal stability, etc.

To accomplish the objects mentioned above, in accordance with the present invention, there is provided a photocurable and thermosetting resin composition characterized by comprising (A) an actinic energy ray-curable resin having at least one structure represented by the following general formula (1), (B) a photopolymerization initiator, (C) a diluent, and (D) a thermosetting component.

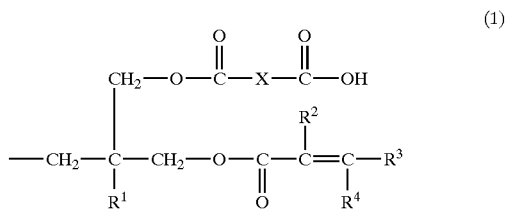

(1)

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

In a preferred embodiment, a resin obtained by reacting 0.1 to 1.0 mol of an unsaturated monocarboxylic acid (b) with one chemical equivalent of an oxetane ring in a polyfunctional oxetane compound (a) and further reacting 0.1 to 1.0 mol of a polybasic acid anhydride (c) with one chemical equivalent of a primary hydroxyl group in the resultant modified oxetane resin (a') is used as the actinic energy ray-curable resin (A) mentioned above. As the unsaturated monocarboxylic acid (b) mentioned above, acrylic acid or methacrylic acid prove to be preferable. The diluent (C) mentioned above is desired to be an organic solvent and/or a polyfunctional polymerizable monomer. As the thermosetting component (D) mentioned above, a polyfunctional epoxy compound (D-1) and/or a polyfunctional oxetane compound (D-2) containing at least two epoxy groups and/or oxetanyl groups in its molecule.

Since the photocurable and thermosetting resin composition of the present invention uses as a photosensitive resin component the alkali-soluble actinic energy ray-curable resin having at least one structure represented by the general formula (1) mentioned above and excelling in thermal stability and resistance to heat, it cures promptly by short-time irradiation of an actinic energy ray and can be developed with an aqueous alkaline solution after exposure to light. Further, it makes possible to obtain a cured product excelling in electrical insulation properties, resistance to heat, adhesiveness, resistance to chemicals, etc. without causing any shrinkage by thermal curing thereof carried out after the exposure to light and development.

DETAILED DESCRIPTION OF THE INVENTION

The present inventors, after continuing a diligent study to solve the problems mentioned above, have found that by using a compound having oxetane rings as a starting raw material instead of an epoxy compound, which causes a secondary hydroxyl group by the reaction with an unsaturated monocarboxylic acid, and by reacting an unsaturated monocarboxylic acid (b) with a polyfunctional oxetane compound (a) and then further reacting a polybasic acid anhydride (c) with a primary hydroxyl group of the resultant modified oxetane resin (a'), there is obtained an actinic energy ray-curable resin of which bonding sites suffer the thermal breakage only with difficulty and which excels in thermal stability and that the use of this resin allows the preparation of an alkali developing type photocurable and thermosetting resin composition excelling in resistance to heat and thermal stability. As a result, the present invention has been perfected. Specifically, the photocurable and thermosetting resin composition of the present invention comprises (A) an actinic energy ray-curable resin derived from an oxetane ring-containing compound as a starting material, (B) a photopolymerization initiator, (C) a diluent, and (D) a thermosetting component, can be developed with an aqueous alkaline solution after exposure to light, and allows formation of a cured film excelling in various properties such as resistance to heat, adhesiveness, electrical insulating properties, and resistance to chemicals by heating a coating film thereof after exposure to light and development, without causing any shrinkage on curing.

Now, the present invention will be described in detail below. First, the actinic energy ray-curable resin (A) to be used in the present invention is obtained by reacting an unsaturated monocarboxylic acid (b) with a polyfunctional oxetane compound (a) and subsequently reacting a polybasic acid anhydride (c) with a primary hydroxyl group of the resultant modified oxetane resin (a'). This reaction process is illustrated as follows.

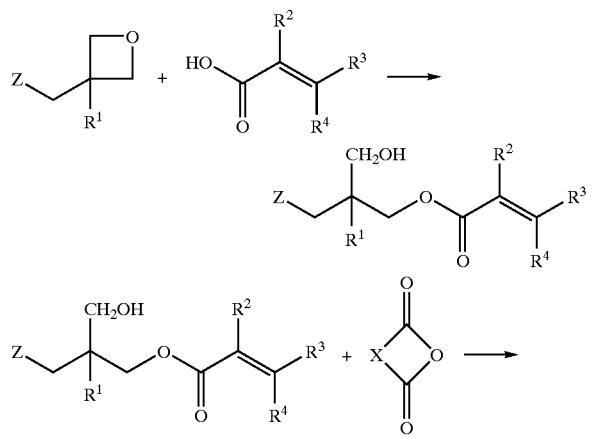

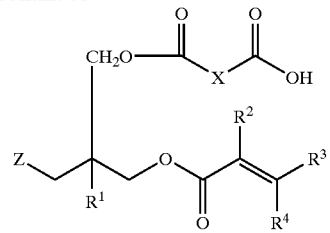

The modified oxetane resin (a') of the reaction intermediate can be synthesized by the reaction of the polyfunctional oxetane compound (a) with the unsaturated monocarboxylic acid (b) in the presence of a suitable reaction promotor. The polyfunctional oxetane compound (a) to be used for the above-mentioned reaction is not limited to a particular compound insofar as it has at least two oxetane rings in its molecule.

As the compound containing two oxetane rings in its molecule, bisoxetanes represented by the following general formula (2) may be cited.

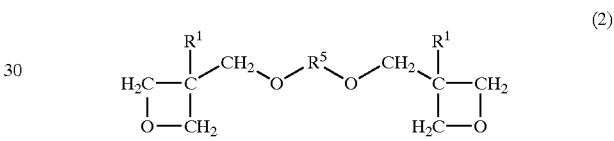

(2)

In the general formula (2) mentioned above, $R^1$ represents the same meaning as mentioned above, and $R^5$ represents a bivalent group selected from among linear or branched saturated hydrocarbons of 1 to 12 carbon atoms, linear or branched unsaturated hydrocarbons of 1 to 12 carbon atoms, aromatic hydrocarbons represented by the following formulas (A), (B), (C), (D), and (E), linear or cyclic alkylene groups containing a carbonyl group and represented by the following formulas (F) and (G), and aromatic hydrocarbons containing a carbonyl group and represented by the following formulas (H) and (I).

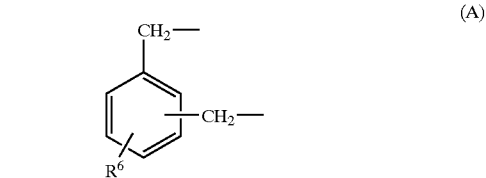

(A)

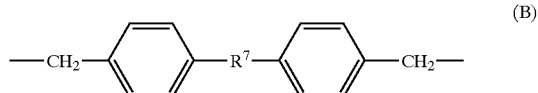

(B)

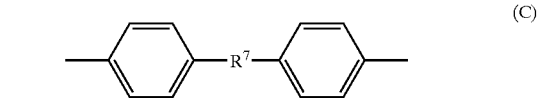

(C)

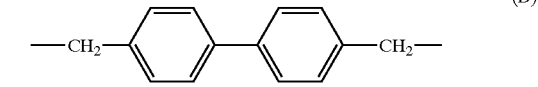

(D)

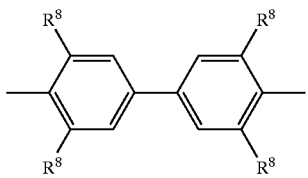

(E)

wherein R[6] represents a hydrogen atom, an alkyl group of 1 to 12 carbon atoms, an aryl group, or an aralkyl group, R[7] represents —O—, —S—, —CH$_2$—, —NH—, —SO$_2$—, —CH(CH$_3$)—, —C(CH$_3$)$_2$—, or —C(CF$_3$)$_2$—, and R[8] represents a hydrogen atom or an alkyl group of 1 to 6 carbon atoms.

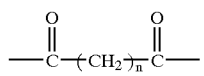

(F)

wherein n represents an integer of 1 to 12.

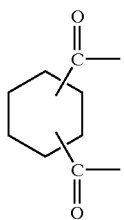

(G)

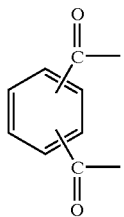

(H)

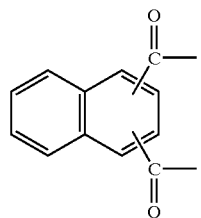

(I)

As the compound containing three or more oxetane rings in its molecule, etherified products of an oxetane with a hydroxyl group-containing resin such as a novolak resin, poly(hydroxy styrene), calixarenes, or a silicone resin like a cylseski oxane besides a compound represented by the following general formula (3) may be cited. In addition thereto, a copolymer of an unsaturated monomer having an oxetane ring and an alkyl (meth)acrylate and the like may be cited. The term "(meth)acrylate" as used in the present specification refers collectively to acrylate and methacrylate. This holds good for other similar expression.

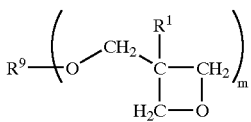

(3)

In the general formula (3) mentioned above, R[1] represents the same meaning as mentioned above, R[9] represents a residue of the hydroxyl group-containing resin of the etherified product mentioned above, a branched alkylene group of 1 to 12 carbon atoms represented by the following formula (J), (K) or (L), or an aromatic hydrocarbon represented by the following formula (M), (N) or (P), and m represents the number of functional groups bonded to the residue R[9], an integer of three or more, preferably an integer of 3 to 5,000.

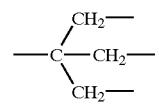

(J)

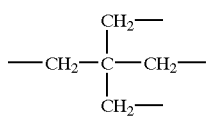

(K)

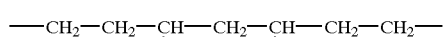

(L)

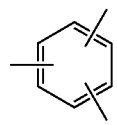

(M)

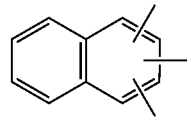

(N)

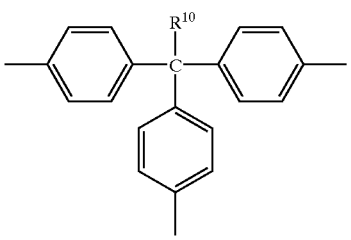

(P)

wherein R[10] represents a hydrogen atom, an alkyl group of 1 to 6 carbon atoms, or an aryl group.

As the unsaturated monocarboxylic acid (b) to be used for the reaction mentioned above, a compound containing a polymerizable unsaturated group and a carboxylic group in combination in its molecule is preferable. As concrete examples, acrylic acid, methacrylic acid, cinnamic acid, crotonic acid, sorbic acid, α-cyanocinnamic acid, β-styryl acrylic acid., etc. may be cited. Alternatively, a half ester of a dibasic acid anhydride with a (meth)acrylate having a hydroxyl group may be used. As concrete examples, the half esters of the acid anhydride such as phthalic acid, tetrahydrophthalic acid, hexahydrophthalic acid, maleic acid, and succinic acid with the hydroxyl group-containing (meth) acrylate such as hydroxyethyl acrylate, hydroxyethyl methacrylate, hydroxypropyl acrylate, and hydroxypropyl methacrylate may be cited. These unsaturated monocarboxylic acids may be used either singly or in the form of a combination of two or more members.

In the reaction mentioned above, the ratio of the polyfunctional oxetane compound (a) to the unsaturated monocarboxylic acid (b) (the charging ratio in the reaction mixture) is desired to be such that the ratio of equivalent weights of oxcetane ring/carboxylic acid is not less than 0.1, more preferably in the range of 0.3 to 1.0. If the ratio of equivalent weights mentioned above is less than 0.1, the compound will be at a disadvantage in acquiring insufficient polymerizable groups introduced into the reaction product and thus an unduly low photocuring properties and, as a result, allowing a coating film to have insufficient properties. Conversely, the ratio of equivalent weights mentioned above exceeding 1.0 is not preferable because the unreacted unsaturated monocarboxylic acid remains. When the unsaturated monocarboxylic acid remains in the unreacted state, it may be removed by a well known method such as vacuum distillation and alkali cleaning.

When the modified oxetane resin (a') of a higher molecular weight is needed, part of the unsaturated monocarboxylic acid (b) to be used in the reaction may be replaced with a polycarboxylic acid or polyphenol of bifunctionality or more functionality. Particularly, it is possible to obtain a linear macromolecular compound in the case of the bifunctional carboxylic acid or phenol and a branched macromolecular compound in the case of the trifunctional carboxylic acid or phenol. As concrete examples of the polycarboxylic acid, bifunctional carboxylic acids such as succinic acid, adipic acid, muconic acid, suberic acid, tetrahydrophthalic acid, hexahydrophthalic acid, hexahydroisophthalic acid, hexahydroterephthalic acid, phthalic acid, isophthalic acid, and terephthalic acid, and trifunctional carboxylic acids such as 1,2,3-propane tricarboxylic acid, citric acid, aconitic acid, and trimellitic acid may be cited. As the examples of the polyphenol, bifunctional phenols such as catechol, resorcin, hydroquinone, 1,4-naphthalene diol, 1,5-naphthalene diol, bisphenol A, and biphenol, and trifunctional phenols such as 2,4,4'-trihydroxybenzophenone and 4,4',4"-methylidene trisphenol may be cited.

As a reaction promotor, any compound may be arbitrarily selected from among a tertiary amine, a quaternary onium salt, a tertiary phosphine, a phosphonium ylide, and a crown ether complex. These compounds may be used either singly or in the form of a combination of two or more members.

As the tertiary amine, triethylamine, tributylamine, DBU (1,8-diazabicyclo[5.4.0]undeca-7-ene), DBN (1,5-diazabicyclo[4.3.0]nona-5-ene), DABCO (1,4-diazabicyclo[2.2.2]octane), pyridine, N,N-dimethyl-4-amino pyridine, etc. may be cited.

As the quaternary onium salt, ammonium salts, phosphonium salts, arsonium salts, stibonium salts, oxonium salts, sulfonium salts, selenonium salts, stannonium salts, iodonium salts, etc. may be cited. Particularly preferable salts are ammonium salts and phosphonium salts. As concrete examples of the ammonium salts, tetra-n-butylammonium halide such as tetra-n-butylammonium chloride (TBAC), tetra-n-butylammonium bromide (TBAB), and tetra-n-butylammonium iodide (TBAI), and tetra-n-butylammonium acetate (TBAAc) may be cited. As concrete examples of the phosphonium salts, tetra-n-butylphosphonium halide such as tetra-n-butylphosphonium chloride (TBPC), tetra-n-butylphosphonium bromide (TBPB), and tetra-n-butylphosphonium iodide (TBBI), tetraphenylphosphonium halide such as tetraphenylphosphonium chloride (TPPC), tetraphenylphosphonium bromide (TPPB), and tetraphenylphosphonium iodide (TPPI), and ethyltriphenylphosphonium bromide (ETPPB), ethyltriphenylphosphonium acetate (ETPPAc), etc. may be cited.

As the tertiary phosphine, any trivalent organic phosphorus compounds containing an alkyl group of 1 to 12 carbon atoms or an aryl group may be used. As concrete examples thereof, triethylphosphine, tributylphosphine, triphenylphosphine, etc. may be cited.

Further, a quaternary onium salt obtained by the addition reaction of a tertiary amine or a tertiary phosphine with a carboxylic acid or a highly acidic phenol may be used as the reaction promotor. They may be in the form of a quaternary salt before adding to the reaction system. Alternatively, they may be individually added to the reaction system so as to form the quaternary salt in the reaction system. As concrete examples thereof, tributylamine acetic acid salt obtained from tributylamine and acetic acid and triphenylphosphine acetic acid salt formed from triphenylphosphine and acetic acid may be cited.

Although any known compounds obtained by the reaction of a phosphonium salt and a base may be used as the phosphonium ylide, a highly stable compound is preferable from the viewpoint of easy handling. As concrete examples thereof, (formylmethylene)triphenylphosphine, (acetylmethylene)triphenylphosphine, (pivaloylmethylene)triphenylphosphine, (benzoylmethylene)triphenylphosphine, (p-methoxybenzoylmethylene)triphenylphosphine, (p-methylbenzoylmethylene)triphenylphosphine, (p-nitrobenzoylmethylene)triphenylphosphine, (naphthoyl)triphenylphosphine, (methoxycarbonyl)triphenylphosphine, (diacetylmethylene)triphenylphosphine, (acetylcyano)triphenylphosphine, (dicyanomethylene)triphenylphosphine, etc. may be cited.

The amount of the reaction promotor to be used is preferred to be in the range of 0.1 to 25 mol %, more preferably in the range of 0.5 to 20 mol %, most preferably in the range of 1 to 15 mol %, based on one mol of the oxetanyl group. If the amount of the reaction promotor to be used is less than 0.1 mol % of the oxetanyl group, the reaction will not proceed at a practical reaction speed. Conversely, a large amount exceeding 25 mol % is not desirable from the economical viewpoint because a remarkable reaction promotion effect will not be obtained even when the promotor is present in such a large amount.

The reaction temperature is preferred to be in the approximate range of 100 to 200° C., more preferably 120 to 160° C. If the reaction temperature is lower than 100° C., the reaction will not proceed to a satisfactory extent. Conversely, the reaction temperature exceeding 200° C. is not desirable from the reasons that the reaction products will tend to cause the thermal polymerization due to the reaction of the double bonds thereof and that the unsaturated monocarboxylic acid having a low boiling point will evaporate. Although the reaction time may be suitably selected depending on the reactivity of the raw materials and the reaction temperature, the preferred reaction time is about 5 to 72 hours.

Next, the reaction of the above resin with a polybasic acid anhydride will be described below. In accordance with the present invention, the actinic energy ray-curable resin is produced by causing 0.1 to 1.0 mol of the polybasic acid anhydride (c) to react with one chemical equivalent of the primary hydroxyl group of the modified oxetane resin (a') produced as described above. Since the primary hydroxyl group caused by the addition reaction of the oxetane ring with the unsaturated monocarboxylic acid is present in the modified oxetane resin (a') and the carboxyl group is introduced into the resin by the addition reaction of this hydroxyl group with the polybasic acid anhydride, the resultant resin will be soluble in an aqueous alkaline solution.

As concrete examples of the polybasic acid anhydrides (c), dibasic or tribasic acid anhydrides such as phthalic anhydride, succinic anhydride, octenylphthalic anhydride, pentadodecenylsuccinic anhydride, maleic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride, tetrabromophthalic anhydride, and trimellitic anhydride; and tetrabasic acid dianhydrides such as biphenyl-tertacarboxylic dianhydride, naphthalene-tertacarboxylic dianhydride, diphenyl ether-tertacarboxylic dianhydride, cyclopentane-tertacarboxylic dianhydride, pyromellitic anhydride, and benzophenone-tetracarboxylic dianhydride may be cited. These polybasic acid anhydrides may be used either singly or in the form of a mixture of two or more members.

The reaction of such a polybasic acid anhydride (c) with the modified oxetane resin (a') may be performed at a temperature in the approximate range of 50 to 150° C., preferably 80 to 130° C. in a proportion mentioned above. The amount of the polybasic acid anhydride to be used is preferred to be in the range of 0.1 to 1.0 mol per one chemical equivalent of the primary hydroxyl group of the modified oxetane resin (a'). The amount of the polybasic acid anhydride lower than 0.1 mol is not preferable from the reason that the amount of the carboxyl groups introduced into the resin is too small and thus sufficient alkali-solubility is not imparted to the resin. Conversely, an unduly large amount exceeding 1.0 is not preferable because the unreacted unsaturated monocarboxylic acid remains in the resin and it will deteriorate the properties of the resin such as durability and electrical insulation properties.

In the reaction of the polybasic acid anhydride (c) with the modified oxetane resin (a') mentioned above, a reaction promotor such as a tertiary amine, a quaternary onium salt, a tertiary phosphine, a phosphonium ylide, a crown ether complex, and an adduct of a tertiary amine or a tertiary phosphine with a carboxylic acid or a highly acidic phenol may be used. The amount of the reaction promotor to be used is preferred to be in the range of 0.1 to 25 mol %, more preferably 0.5 to 20 mol %, most preferably 1 to 15 mol %, of the polybasic acid anhydride (c). If the catalyst used for the reaction of the unsaturated monocarboxylic acid mentioned above still remains in the system, however, the reaction will be promoted even if the catalyst is not newly added.

Although the aforementioned reaction of the polyfunctional oxetane compound (a) with the unsaturated monocarboxylic acid (b) and the reaction of the modified oxetane resin (a') with the polybasic acid anhydride (c) proceed either in the presence of an organic solvent or in the absence of a solvent, the reaction may also be performed in the presence of a diluent to be described hereinafter for the purpose of improving the agitating effect during the reaction. When an organic solvent is used as the diluent during the synthesis, the solvent may be removed by a well-known method such as vacuum distillation.

As the organic solvent, any known organic solvents may be used insofar as they will not exert a harmful influence on the reaction and can keep the reaction temperature. As concrete examples thereof, alcohols such as diethyleneglycol monomethyl ether, diethylene glycol monoethyl ether, dipropylene glycol monomethyl ether, and dipropylene glycol monobutyl ether; glycol esters such as ethylene glycol monomethyl ether acetate, diethylene glycol monomethyl ether acetate, diethylene glycol monoethyl ether acetate, propylene glycol monomethyl ether acetate, and dipropylene glycol monomethyl ether acetate; ethers such as diethylene glycol dimethyl ether and dipropylene glycol dimethyl ether; ketones such as methylisobutyl ketone and cyclohexanone; and hydrocarbons such as toluene and xylene may be cited.

In the aforementioned reaction of the polyfunctional oxetane compound (a) with the unsaturated monocarboxylic acid (b) and the reaction of the modified oxetane resin (a') with the polybasic acid anhydride (c), air blowing or the addition of a polymerization inhibitor may be done for the purpose of preventing the reaction mixture from gelation due to polymerization of the unsaturated double bonds. As the examples of the polymerization inhibitor, hydroquinone, toluquinone, methoxyphenol, phenothiazine, triphenyl antimony, copper chloride, etc. may be cited.

By mixing the actinic energy ray-curable resin (A) obtained by the method of the present invention with a compound which generates radicals by irradiation of an actinic energy ray, i.e. a photopolymerization, the resultant composition becomes photocurable.

As concrete examples of the photopolymerization initiator (B), benzoin and alkyl ethers thereof such as benzoin, benzoin methyl ether, and benzoin ethyl ether; acetophenones such as acetophenone, 2,2-dimethoxy-2-phenyl acetophenone and 4-(1-t-butyldioxy-1-methylethyl) acetophenone; anthraquinones such as 2-methylanthraquinone, 2-amylanthraquinone, 2-t-butyl anthraquinone, and 1-chloroanthraquinone; thioxanthones such as 2,4-dimethylthioxanthone, 2,4-diisopropylthioxanthone, and 2-chlorothioxanthone; ketals such as acetophenone dimethyl ketal and benzyl dimethyl ketal; benzophenones such as benzophenone, 4-(1-t-butyldioxy-1-methylethyl) benzophenone, and 3,3',4,4'-tetrakis(t-butyldioxycarbonyl) benzophenone; aminoacetophenones such as 2-methylthio-1-[4-(methylthio) phenyl]-2-morpholino-propan-1-one and 2-benzyl-2-dimethylamino-1-(4-morpholinophenyl)-butan-1-one; alkylphosphines such as 2,4,6-trimethylbenzoyl phosphine oxide; and acryzines such as 9-phenyl acryzine may be cited.

These photopolymerization initiators may be used either singly or in the form of a mixture of two or more members. The amount of the photopolymerization initiator to be used is preferred to be in the range of 0.1 to 30 parts by weight, based on 100 parts by weight of the actinic energy ray-curable resin. If the amount of the photopolymerization initiator to be used is less than 0.1 part by weight, the composition will not be photocured by irradiation of an actinic energy ray or the irradiation time should be prolonged, and a coating film of satisfactory properties will be obtained only with difficulty. Conversely, even if the photopolymerization initiator is added to the composition in a large amount exceeding 30 parts by weight, the composition will not attain the further improvement in the curing properties and such a large amount is not desirable from the economical viewpoint.

In the photocurable and thermosetting resin composition of the present invention, for the purpose of improving the curing with an actinic energy ray, a curing promotor or sensitizer may be used in combination with the photopolymerization initiator mentioned above. As the curing promotor or sensitizer which is usable herein, tertiary amines such as triethylamine, triethanolamine, 2-dimethylaminoethanol, N,N-(dimethylamino)ethyl benzoate, N,N-(dimethylamino) isoamyl benzoate, and pentyl-4-dimethylamino benzoate; thioethers such as β-thiodiglycol; sensitizing dyestuff such as (keto)cumalin and thioxantene; and alkyl borates of such dyestuff as cyanine, rhodamine, safranine, malachite green, and methylene blue may be cited. These curing promotors or sensitizers may be used independently either singly or in the form of a mixture of two or more members. The amount of the curing promotor or sensitizer to bemused is preferred to be in the range of 0.1 to 30 parts by weight, based on 100 parts by weight of the actinic energy ray-curable resin mentioned above.

Further, the photocurable and thermosetting resin composition of the present invention contais a diluent. As the diluent (C), a compound having a polymerizable group which is capable of taking part in the curing rection can be used besides an organic solvent. Any known reactive diluents such as, for example, monofunctional acrylates and/or polyfunctional acrylates can be used. As concrete examples thereof, methyl (meth)acrylate, ethyl (meth)acrylate, n-butyl (meth)acrylate, isobutyl (metha)crylate, 2-ethylhexyl (meth) acrylate, isodecyl (meth)acrylate, lauryl (meth)acrylate, tridecyl (meth)acrylate, stearyl (meth)acrylate, methoxypolyethylene glycol (meth)acrylate, cyclohexyl (meth) acrylate, tetrahydrofurfuryl (meth)acrylate, isobornyl (meth) acrylate, benzyl (meth)acrylate, 2-hydroxyethyl (meth) acrylate, 2-hydroxypropyl (meth)acrylate, 2-hydroxybutyl (meth)acrylate, dimethylaminoethyl (meth)acrylate, ethylene glycol di(meth)acrylate, diethylene qlycol di(meth) acrylate, 1,4-butanediol di(meth)acrylate, 1,6-hexanediol di(meth)acrylate, trimethylol propane tri(meth)acrylate, glycerin di(meth)acrylate, pentaerythritol tri(meth)acrylate, pentaerythritol tetra(meth)acrylate, dipentaerythritol hexa (meth)acrylate, polyester acrylate, reaction products of a dibasic acid anhydride with an alcohol containing at least one unsaturated group in its molecule, etc. may be cited. The diluents (C) may be used either singly or in the form of a mixture of two or more members and the amount thereof is not limited to a particular range.

As the thermosetting component (D) to be added to the photocurable and thermosetting resin composition of the present invention, a polyfunctional epoxy compound (D-1) and/or a polyfunctional oxetane compound (D-2) having at least two epoxy groups and/or oxetanyl groups.

As the polyfunctional epoxy compound (D-1), any compound may be used insofar as it contains at least two epoxy groups in its molecule. As the examples of the epoxy compound, various well-known and widely used epoxy compounds, for example, glycidyl ether compounds such as bisphenol A epoxy resin, bisphenol F epoxy resin, bisphenol S epoxy resin, brominated bisphenol A epoxy resin, hydrogenated bisphenol A epoxy resin, biphenol epoxy resin, bixylenol epoxy resin, alicyclic epoxy resin, phenol novolak epoxy resin, cresol novolak epoxy resin, brominated phenol novolak epoxy resin, and novolak epoxy resin of bisphenol A; glycidyl ester compounds such as terephthalic diglycidyl ester, hexahydrophthalic diglycidyl ester, and dimeric diglycidyl ester; glycidyl amine compounds such as N,N,N',N'-tetraglycidyl methaxylene diamine, N,N,N',N'-tetraglycidyl bis(aminomethyl)-cyclohexane, and N,N-diglycidyl aniline; and heterocyclic epoxy compounds such as triglycidyl isocyanurate may be cited. These epoxy resins may be used either singly or in the form of a combination of two or more members. Although any epoxy resins which exhibit sparing solubility or solubility in a diluent (C) to be used may be used as the epoxy resin, the finely pulverized epoxy resin which exhibits sparing solubility in a diluent and is in the state of solid or semi-solid at room temperature or a mixture of this sparingly soluble epoxy resin and the soluble epoxy resin prove to be particularly desirable from the viewpoint of developability etc.

As typical examples of the polyfunctional oxetane compound (D-2) to be used as the thermosetting component in the photocurable and thermosetting composition of the present invention, bisoxetanes containing two oxetane rings in their molecules and trisoxetanes or the like containing three or more oxetane rings in their molecules as enumerated hereinbefore may be cited. These oxetane compounds may be used either singly or in the form of a combination of two or more members.

The amount of the polyfunctional epoxy compound (D-1) and/or the polyfunctional oxetane compound (D-2) mentioned above to be incorporated in the composition is desired to be in the range of 20 to 90 parts by weight, based on 100 parts by weight of the actinic energy ray-curable resin (A) mentioned above. If the amount of the thermosetting component to be used is less than the lower limit of the range mentioned above, the thermal cure of the composition tends to be insufficient, which is undesirable from the viewpoint of the properties of a cured film, such as resistance to heat, resistance to chemicals, electrical insulating properties, and hardness.

Further, for the purpose of promoting the thermal curing reaction, a small amount of a well-known curing promotor such as quaternary ammonium salts, quaternary phosphonium salts, tertiary amines, and imidazoles mentioned above and dicyandiamide may be used in combination therewith.

The photocurable and thermosetting resin composition of the present invention may incorporate therein, when necessary, a well-known and widely used filler such as barium sulfate, silica, talc, clay, and calcium carbonate, a well-known and widely used coloring pigment such as phthalocyanine blue, phthalocyanine green, titanium oxide, and carbon black, and various additives such as an antifoaming agent, an adhesiveness-imparting agent, and a leveling agent.

The photocurable and thermosetting resin composition obtained as described above is adjusted to a suitable level of viscosity by addition of the diluent etc., applied by a suitable coating method such as a screen printing method, a curtain coating method, a roll coating method, a dip coating method, and a spin coating method to a substrate of a printed circuit board, and then predried at a temperature in the approximate range of 60 to 120° C., for example, thereby to remove the organic solvent from the composition and give rise to a coating film. Thereafter, the coating film is selectively exposed to an actinic energy ray through a photomask having a prescribed exposure pattern and the unexposed areas of the coating film is developed with an aqueous alkaline solution to obtain a resist pattern. The coating film is further thermally cured by subjecting to the heat treatment at a temperature in the approximate range of 100 to 200° C. for about 30 to 60 minutes for the purpose of effecting sufficient cure.

As an aqueous alkaline solution to be used in the development mentioned above, aqueous solutions of sodium hydroxide, potassium hydroxide, sodium carbonate, potassium carbonate, sodium silicate, ammonia, organic amines, tetramethylammonium hydroxide, etc. may be used. The concentration of an alkali in the developing solution may be proper generally in the range of 0.1 to 5.0 wt. %. As the developing method, various known methods such as dipping development, paddling development, and spraying development may be used.

The light sources for irradiation which are properly used for the purpose of photo-curing the photocurable and thermosetting resin composition of the present invention include a low-pressure mercury vapor lamp, a medium-pressure mercury vapor lamp, a high-pressure mercury vapor lamp, an ultra-high-pressure mercury vapor lamp, a xenon lamp, and a metal halide lamp, for example. Laser beams may also be utilized as the actinic ray for exposure. Further, electron beams, α-rays, β-rays, γ-rays, X-rays, neutron beams, etc. may be utilized.

Now, the present invention will be described more specifically below with reference to working examples. Wherever the terms "parts" and "%" are used hereinbelow, they invariably refer to those based on weight unless otherwise specified.

SYNTHESIS EXAMPLE 1

Into a 200 ml four-necked flask equipped with a stirrer, a reflux condenser, and a thermometer, 36.2 g (0.1 mol) of terephthalate bisoxetane (manufactured by Ube Kosan K.K.), 17.2 g (0.2 mol) of methacrylic acid, 2.1 g (0.005 mol) of tetraphenylphosphonium bromide, and 0.1 g of methoquinone were charged and stirred at 140° C. for 12 hours. After the decrease in absorption caused by the oxetane ring at 980 cm$^{-1}$ has been confirmed by IR spectrum and the reduction of the acid value to a level of not more than 20 mg KOH/g has been also confirmed, the temperature of the reaction mixture was lowered to 100° C. and then 18.0 g (0.118 mol) of tetrahydrophthalic anhydride was added to the mixture. The mixture was further stirred at 100° C. for 3 hours. The product obtained had an acid value of 157 mg KOH/g.

It could be confirmed by the IR spectrum of the product obtained that the absorption of the primary hydroxyl group and the acid anhydride disappeared and the broad absorption originated from the carboxyl group appeared. Therefore, it has been confirmed that the ring opening addition of the acid anhydride to the modified oxetane resin was performed and the carboxyl groups were introduced into the resin. The resultant product was soluble in an aqueous 1% sodium carbonate solution. Hereinafter, this resin solution will be referred to as "varnish-A".

SYNTHESIS EXAMPLE 2

Into a 200 ml four-necked flask equipped with a stirrer, a reflux condenser, and a thermometer, 33.4 g (0.1 mol) of xylylene bisoxetane (manufactured by Toa Gosei K.K., product name "XDO"), 17.2 g (0.2 mol) of methacrylic acid, 2.1 g (0.005 mol) of tetraphenylphosphonium bromide, and 0.1 g of methoquinone were charged and stirred at 130° C. for 24 hours. After the reduction of the acid value to a level of not more than 20 mg KOH/g has been confirmed, the temperature of the reaction mixture was lowered to 100° C. and then 18.0 g (0.118 mol) of tetrahydrophthalic anhydride was added to the mixture. The mixture was further stirred at 100° C. for 3 hours. The product obtained had an acid value of 147 mg KOH/g. The resultant product was soluble in an aqueous 1% sodium carbonate solution. Hereinafter, this resin solution will be referred to as "varnish-B".

SYNTHESIS EXAMPLE 3

2.04 g of phenol novolak type oxetane (number of nuclei= 7) and 0.86 g of methacrylic acid, 0.21 g of tetraphenylphosphonium bromide, 3.0 g of propylene glycol monomethyl ether acetate, and 0.01 g of methoquinone added thereto were stirred at 140° C. for 24 hours. The reaction temperature was lowered to 100° C. and then 0.92 g of tetrahydrophthalic anhydride was added to the mixture. The mixture was further stirred for 3 hours. The product obtained had an acid value of 84 mg KOH/g. Hereinafter, this resin solution will be referred to as "varnish-C".

SYNTHESIS EXAMPLE 4

A mixture of 50.1 g of methyl methacrylate, 92.1 g of (3-ethyl-3-oxetanyl)methyl methacrylate, and 4.9 g of azobisisobutyronitrile was added dropwise to 142.2 g of propylene glycol monomethyl ether acetate heated to 80° C. in advance over a period of 2 hours and stirred at the same temperature for 8 hours to synthesize an oxetane ring-containing copolymeric resin. The number-average molecular weight of the copolymer determined by GPC was 12,000. To this resin solution, 44.5 g of methacrylic acid, 5.2 g of tetraphenylphosphonium bromide, and 0.4 g of methoquinone were added and the resultant mixture was stirred at 140° C. for 12 hours. The temperature was lowered to 100° C. and then 60.8 g of tetrahydrophthalic anhydride was added to the mixture. The mixture was further stirred at 100° C. for 3 hours to obtain an actinic energy ray-curable resin solution having an acid value of a solid content of 91 mg KOH/g. Hereinafter, this resin solution will be referred to as "varnish-D".

EXAMPLES 1–4

The raw materials shown in Table 1 mentioned below were mixed at proportions shown in Table 2 and kneaded with a three-roll mill to prepare a photocurable and thermosetting resin composition.

TABLE 1

| Components | Chemical name or product name |
|---|---|
| Photosensitive resin | Varnish-A obtained in Synthesis Example 1 |
| | Varnish-B obtained in Synthesis Example 2 |
| | Varnish-C obtained in Synthesis Example 3 |
| | Varnish-D obtained in Synthesis Example 4 |
| Photopolymerization initiator | 2-Methyl-1-[4-(methylthio)phenyl]-2-morphorino-propan-1-one |
| Photopolymerizable monomer | Dipentaerythritol hexaacrylate |
| Epoxy resin | TEPIC (manufactured by Nissan Chemical Industries Ltd.) |
| Curing promotor | 2-Phenyl imidazol |
| Additive | Organobentonite |
| Diluent | Dipropylene glycol |

TABLE 2

| Components and amounts (parts) | Example No. | | | |
|---|---|---|---|---|
| | 1 | 2 | 3 | 4 |
| Varnish (solid content) | | | | |
| A | 100 | — | — | — |
| B | — | 100 | — | — |
| C | — | — | 100 | — |
| D | — | — | — | 100 |
| Photopolymerization initiator | 10 | 10 | 10 | 10 |
| Photopolymerizable monomer | 20 | 20 | 20 | 20 |
| Epoxy resin | 30 | 30 | 30 | 30 |
| Curing promotor | 1 | 1 | 1 | 1 |
| Additive | 1 | 1 | 1 | 1 |
| Diluent | 5 | 10 | 5 | 10 |

The photocurable and thermosetting resin compositions obtained in Examples 1–4 were tested for the following properties.

Evaluation of Quality:

(1) Developability

Each of the compositions obtained in Examples 1–4 mentioned above was applied to a copper foil by means of an applicator and then dried by heating at 80° C. for 20 minutes. The resultant substrate was immersed in an aqueous 1% sodium carbonate solution and subjected to measurement of the time required for the complete dissolution and removal of the composition.

(2) Adhesiveness:

Each of the compositions obtained in Examples 1–4 mentioned above was applied to a copper foil by means of an applicator in a film thickness of 25 μm, dried by heating at 80° C. for 20 minutes, then photo-cured by irradiation with UV light at a cumulative dose of 500 mJ/cm², and further thermally cured by heating at 150° C. for 30 minutes to produce a test substrate. A coating film of each test substrate was incised like cross-cut in the shape of squares in a go board and then subjected to a peeling test with a cellophane adhesive tape in accordance with the method specified in JIS (Japanese Industrial Standard) D-0202 to visually examine the degree of separation of the coating film. The criterion for evaluation is as follows:

⊚:     100/100 and perfect absence of any discernible change
○:     100/100, but slight peeling in edge portions of the coating film
Δ:     50/100–90/100
X:     0/100–50/100

(3) Solvent Resistance

Test substrates were prepared under the same conditions as in the test for adhesiveness in item (2) mentioned above. Each coating film was rubbed with a waste cloth impregnated with acetone ten times and visually examined to find a change in the coating film. The criterion for evaluation is as follows:

⊚:     Perfect absence of any discernible change was found.
○:     Slight change was found.
Δ:     Half of the coating film was dissolved out.
X:     All the coating film was dissolved and removed.

(4) Resistance to Soldering Heat

Test substrates were prepared under the same conditions as in the test for adhesiveness in item (2) mentioned above. Each of the test substrates was immersed for 10 seconds in a solder bath set in advance at 260° C. and visually examined to find the extents of swelling and separation of the resist layer.

⊚:     Perfect absence of any discernible change was found.
○:     Slight change was found.
Δ:     Swelling or separation of a coating film was not more than 20%.
X:     Swelling or separation of a coating film was not less than 20%.

The results of the above tests are collectively shown in Table 3.

TABLE 3

| Properties evaluated | Example No. | | | |
| --- | --- | --- | --- | --- |
|  | 1 | 2 | 3 | 4 |
| Developability (seconds) | 60 | 90 | 180 | 180 |
| Adhesiveness | ○ | ○ | ○ | ○ |
| Solvent resistance | ⊚ | ⊚ | ⊚ | ⊚ |
| Resistance to soldering heat | ○ | ○ | ⊚ | ⊚ |

As being clear from the results shown in Table 3, the photocurable and thermosetting resin compositions of the present invention obtained in Examples 1–4 were developable with an alkali solution and exhibited good photo-curing properties. Further, it has been confirmed that the films excelling in resistance to heat and solvent resistance may be formed by the subsequent thermal curing reaction.

While certain specific embodiments and working examples have been disclosed herein, the invention may be embodied in other specific forms without departing from the spirit or essential characteristics thereof. The described embodiments and examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photocurable and thermosetting resin composition, comprising:

(A) an actinic energy ray-curable resin having at least one structure represented by the following general formula (1);
(B) a photopolymerization initiator;
(C) a diluent; and
(D) a thermosetting component,

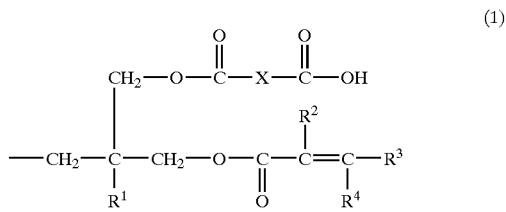

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

2. The composition according to claim 1, wherein said actinic energy ray-curable resin (A) is a resin obtained by reacting 0.1 to 1.0 mol of an unsaturated monocarboxylic acid (b) with one chemical equivalent of an oxetane ring in a polyfunctional oxetane compound (a) having at least two oxetane rings to produce a modified oxetane resin (a') and subsequently reacting 0.1 to 1.0 mol of a polybasic acid anhydride (c) with one chemical equivalent of a primary hydroxyl group in the resultant modified oxetane resin (a').

3. The composition according to claim 2, wherein said unsaturated monocarboxylic acid (b) is acrylic acid, methacrylic acid, or a mixture thereof.

4. The composition according to claim 1, wherein said diluent (C) is at least one compound selected from the group consisting of an organic solvent and a polyfunctional polymerizable monomer.

5. The composition according to claim 1, wherein said thermosetting component (D) is at least one compound selected from the group consisting of (D-1) a polyfunctional epoxy compound containing at least two epoxy groups in its molecule and (D-2) a polyfunctional oxetane compound containing at least two oxetanyl groups in its molecule.

6. The composition according to claim 1, wherein said photopolymerization initiator (B) is in an amount of 0.1 to 30 parts by weight and said thermosetting component (D) is in an amount of 20 to 90 parts by weight, respectively based on 100 parts by weight of said actinic energy ray-curable resin (A).

7. The composition according to claim 1, further comprising:
a curing promoter.

8. The composition according to claim 1, further comprising:
at least one additive selected from the group consisting of a filler, a coloring pigment, an anti-foaming agent, and a leveling agent.

9. A photocurable and thermosetting resin composition, comprising:
(A) an actinic energy ray-curable resin having at least one structure represented by the following general formula (1);
(B) a photopolymerization initiator;
(C) a diluent; and
(D) an epoxy resin,

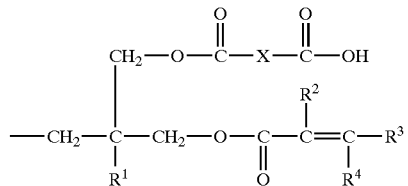

(1)

wherein R1 represents a hydrogen atom or an alkyl group of 1 to 6 carbon atoms, R2, R3 and R4 independently represent a hydrogen atom, an alkyl group of 1 to 6 carbon atoms, an aryl group, an aralkyl group, a cyano group, a fluorine atom, or a furyl group, and X represents a polybasic acid anhydride residue.

10. The composition according to claim 9, wherein said actinic energy ray-curable resin (A) is a resin obtained by reacting 0.1 to 1.0 mol of an unsaturated monocarboxylic acid (b) with one chemical equivalent of an oxetane ring in a polyfunctional oxetane compound (a) having at least two oxetane rings to produce a modified oxetane resin (a') and subsequently reacting 0.1 to 1.0 mol of a polybasic acid anhydride (c) with one chemical equivalent of a primary hydroxyl group in the resultant modified oxetane resin (a').

* * * * *

UNITED STATES PATENT AND TRADEMARK OFFICE
CERTIFICATE OF CORRECTION

PATENT NO. : 6,867,282 B2
DATED : March 15, 2005
INVENTOR(S) : Tadatomi Nishikubo et al.

It is certified that error appears in the above-identified patent and that said Letters Patent is hereby corrected as shown below:

<u>Column 18,</u>
Line 14, "R1," should read -- $R^1$, --.
Line 15, replace "R2, R3, and R4" with -- $R^2$, $R^3$, and $R^4$ --.

Signed and Sealed this

Fifth Day of July, 2005

JON W. DUDAS
*Director of the United States Patent and Trademark Office*